United States Patent
Bardagjy et al.

(10) Patent No.: US 11,445,096 B1
(45) Date of Patent: Sep. 13, 2022

(54) HOLDER ON GLASS IMAGING MODULE

(71) Applicant: Meta Platforms Technologies, LLC, Menlo Park, CA (US)

(72) Inventors: Andrew Matthew Bardagjy, Seattle, WA (US); Likai Li, Cupertino, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/308,048

(22) Filed: May 5, 2021

(51) Int. Cl.
*H04N 5/225* (2006.01)
*H01L 27/146* (2006.01)

(52) U.S. Cl.
CPC ..... *H04N 5/2254* (2013.01); *H01L 27/14625* (2013.01); *H04N 5/2253* (2013.01); *H04N 5/2257* (2013.01)

(58) Field of Classification Search
CPC .. H04N 5/2254; H04N 5/2253; H04N 5/2257; H01L 27/14625
See application file for complete search history.

(56) References Cited

U.S. PATENT DOCUMENTS

| | | | | |
|---|---|---|---|---|
| 2009/0130791 A1* | 5/2009 | Kwon | | H04N 5/2253 438/64 |
| 2011/0037887 A1* | 2/2011 | Lee | | G02B 13/0085 348/340 |
| 2013/0222657 A1* | 8/2013 | Shimotsusa | | H01L 27/14625 257/432 |
| 2015/0054993 A1* | 2/2015 | Borthakur | | H04N 5/2257 348/262 |
| 2016/0037036 A1* | 2/2016 | Lim | | H04N 5/2253 348/374 |
| 2016/0381262 A1* | 12/2016 | Shi | | H04N 13/239 348/47 |
| 2020/0225552 A1* | 7/2020 | Abbott, Jr. | | G02B 5/223 |
| 2020/0387049 A1* | 12/2020 | Kimura | | H04N 5/232 |
| 2021/0314468 A1* | 10/2021 | Liang | | G02B 3/0031 |

* cited by examiner

*Primary Examiner* — Amy R Hsu
(74) *Attorney, Agent, or Firm* — Freestone Intellectual Property Law PLLC; Aaron J. Visbeek (57) ABSTRACT

Coverglass is disposed over an image sensor. The coverglass includes a trench extending a depth into the coverglass. The trench is configured to receive a lens assembly and the lens assembly may be bonded to the trench.

20 Claims, 7 Drawing Sheets

HOLDER ON GLASS IMAGING MODULE

TECHNICAL FIELD

This disclosure relates generally to optics, and in particular to image sensing.

BACKGROUND INFORMATION

Cameras have become ubiquitous in consumer electronics. For example, smart phones, tablets, action-cameras, laptops, and even monitors may incorporate a camera. Typically, the cameras that are incorporated into consumer electronics include a lens assembly. For example, a lens assembly may be optically coupled to focus light onto an image sensor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a holder on glass imaging module are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In aspects of this disclosure, visible light may be defined as having a wavelength range of approximately 380 nm-700 nm. Non-visible light may be defined as light having wavelengths that are outside the visible light range, such as ultraviolet light and infrared light. Infrared light having a wavelength range of approximately 700 nm-1 mm includes near-infrared light. In aspects of this disclosure, near-infrared light may be defined as having a wavelength range of approximately 700 nm-1.4 µm.

In aspects of this disclosure, the term "transparent" may be defined as having greater than 90% transmission of light. In some aspects, the term "transparent" may be defined as a material having greater than 90% transmission of visible light.

Implementations of the disclosure include a camera assembly that includes an image sensor, a lens assembly, and coverglass having a trench to receive the lens assembly. The trench may be etched in the coverglass for example. Including a trench in the coverglass may allow for a z-height reduction with respect to optical elements (e.g. lenses) included in the lens assembly. This z-height reduction allows for a smaller camera assembly overall and may also allow for increased optical design freedoms for an optical assembly with respect to the image sensor. In some implementations, the trench in the coverglass also improves bonding strength for bonding the lens assembly. In some implementations the trench in the coverglass may be keyed to align the lens assembly with the image sensor. These and other embodiments are described in more detail in connection with FIGS. 1-3F.

Figure 1:
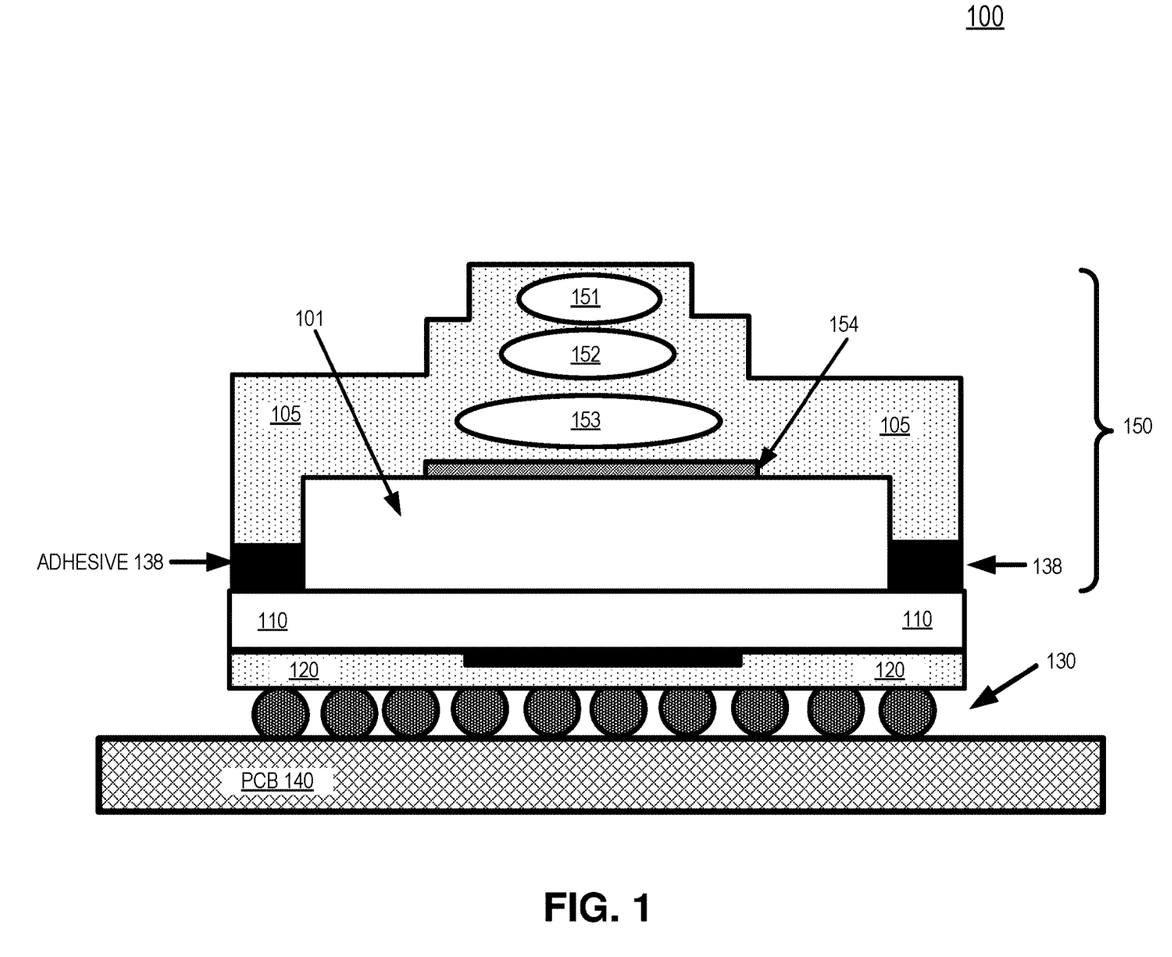
FIG. 1 illustrates a camera module including a lens assembly disposed over an image sensor module to focus image light to an image sensor.

FIG. 1 illustrates a camera module 100 including a lens assembly 150 disposed over image sensor module 101 to focus image light to image sensor 120. Lens assembly 150 includes an assembly body 105 that includes optical elements 151, 152, 153, and 154. Optical elements 151, 152, and 153 may be refractive optical elements for focusing image light. The refractive optical elements may be made of glass or plastic, for example. Optical element 154 may be a filtering layer. Filtering layer 154 may be a polarizer, in some examples. Filtering layer 154 may filter out ultraviolet (UV), visible light, and/or infrared light, depending on the imaging context. In the illustration of FIG. 1, glue layer 138 adheres assembly body 105 to coverglass 110 of image sensor module 101 to secure lens assembly 150 to focus image light to image sensor 120. Image sensor module 101 includes coverglass layer 110 disposed over image sensor 120 and solder ball grid array 130. Solder ball grid array 130 electrically couples image sensor 120 to electrical pads (not illustrated) of the printed circuit board (PCB) layer 140, in the illustrated embodiment.

Figure 2A:
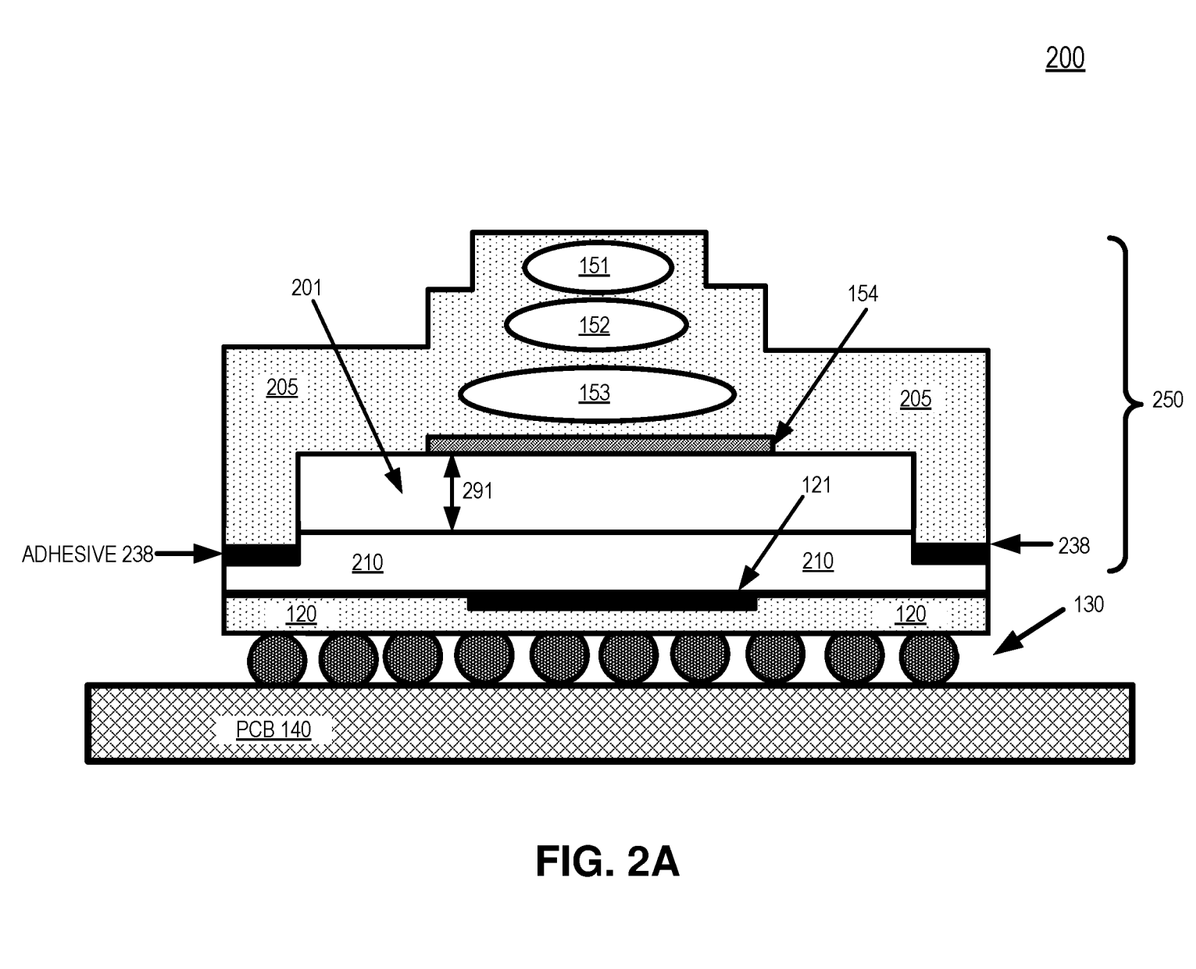
FIG. 2A illustrates a camera assembly including a lens assembly disposed over an image sensor module to focus image light onto an image pixel array of an image sensor, in accordance with aspects of the disclosure.

FIG. 2A illustrates a camera assembly 200 including a lens assembly 250 disposed over image sensor module 201 to focus image light onto an image pixel array 121 of image sensor 120, in accordance with aspects of the disclosure. Image sensor module 201 includes image sensor 120, solder ball grid array 130, and coverglass 210. Image sensor module 201 may be considered a chip scale package (CSP) image sensor. Lens assembly 250 includes assembly body 205 that includes optical elements 151, 152, 153, and 154. FIG. 2A illustrates that coverglass 210 is disposed over image sensor 120 and disposed between image sensor 120 and lens assembly 250. Coverglass 210 includes a trench. An adhesive 238 in the trench bonds the lens assembly 250 to the trench of coverglass 210. In the illustrated implementation of FIG. 2A, adhesive 238 bonds assembly body 205 to coverglass 210. Forming a trench in coverglass 210 allows for a reduced z-height 291 between image sensor 120 and a first optical element (e.g. optical element 154 or 153) of lens assembly 250.

Figure 2B:
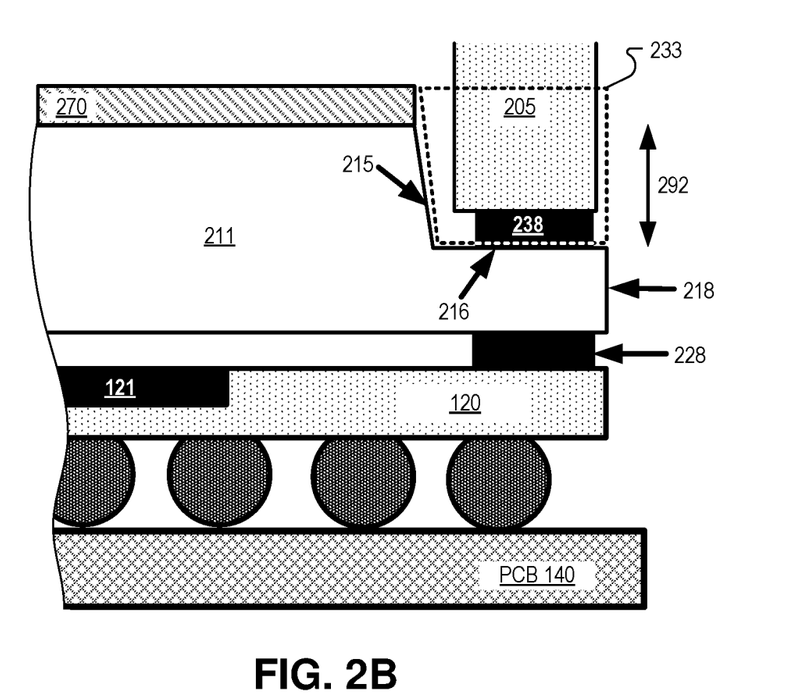
FIG. 2B illustrates a side view of an example trench extending into an example coverglass, in accordance with aspects of the disclosure.

FIG. 2B illustrates a side view of an example trench 233 extending a depth 292 into example coverglass 211, in accordance with aspects of the disclosure. Coverglass 211 may be used as coverglass 210, for example. Coverglass 211 is bonded to image sensor 120 by adhesive layer 228, in FIG. 2B. FIG. 2B also illustrates that optical layer 270 may be disposed on coverglass 211 and that trench 233 may extend through optical layer 270. Optical layer 270 may be a wavelength-specific filter, for example.

Forming trench 233 into coverglass 211 may be accomplished using a subtractive process such as diamond-turning or pattern etching. When etching is used to form trench 233, sidewall 215 of trench 233 may be sloped and trench 233 may be slightly larger at the top than a bottom 216 of trench 233. Etching trench 233 may form a surface roughness at the bottom 216 of trench 233 that is greater than a surface roughness of the top surface of coverglass 211 and of a top surface of optical layer 270. The surface roughness of trench bottom 216 may increase the bonding strength of lens assembly 250 to image sensor module 201 when compared with bonding to the top of coverglass 211 or bonding to optical layer 270. Bonding lens assembly 250 to optical layer 270 may risk delaminating optical layer 270 from coverglass 211 and thus bonding lens assembly 250 directly to coverglass 211 inside trench 233 increases the bond strength. Etching processes to form trench 233 may include chemical etching (e.g. acid etch). Photolithography techniques may be used in the etching process. Mechanical etching such as sand blasting or grinding may be used to form trench 233.

Trench 233 has a depth 292 that is a portion of the thickness of coverglass 211, in FIG. 2B. Depth 292 may be between 50 microns and 400 microns, in some implementations. In some implementations, adhesive 238 is an active alignment adhesive. Trench 233 is formed over image sensor 120 but not over image pixel array 121 so that trench 233 does not occlude image light from propagating to image pixel array 121 of image sensor 120.

Figure 2C:
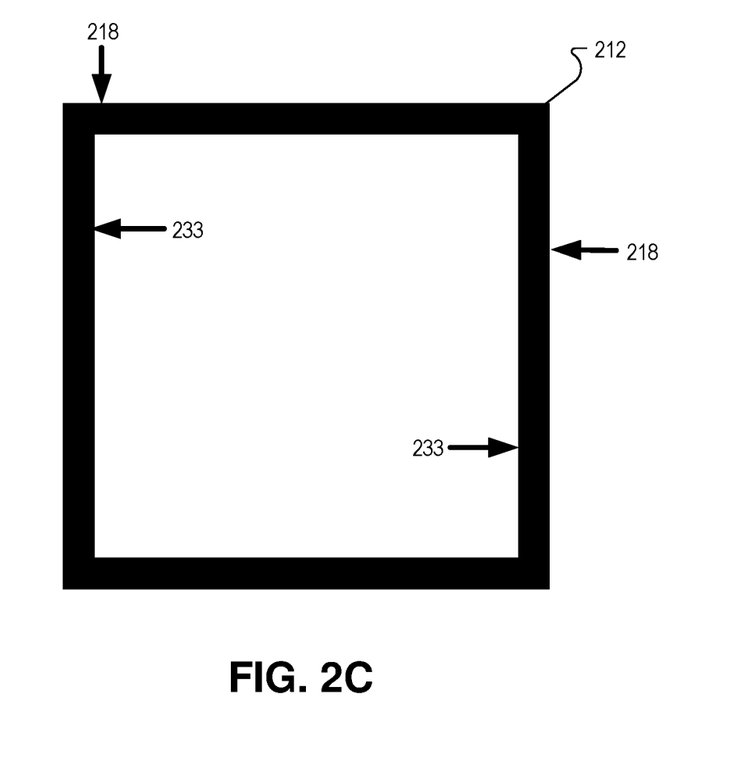
FIG. 2C illustrates a top view of an example coverglass where the trench extends to the outside boundary of the coverglass, in accordance with aspects of the disclosure.

FIG. 2C illustrates a top view of an example coverglass 212 where the trench 233 extends to the outside boundary 218 of coverglass 212, in accordance with aspects of the disclosure. In this implementation, trench 233 may only have one sidewall 215, as illustrated in FIG. 2B.

Figure 2D:
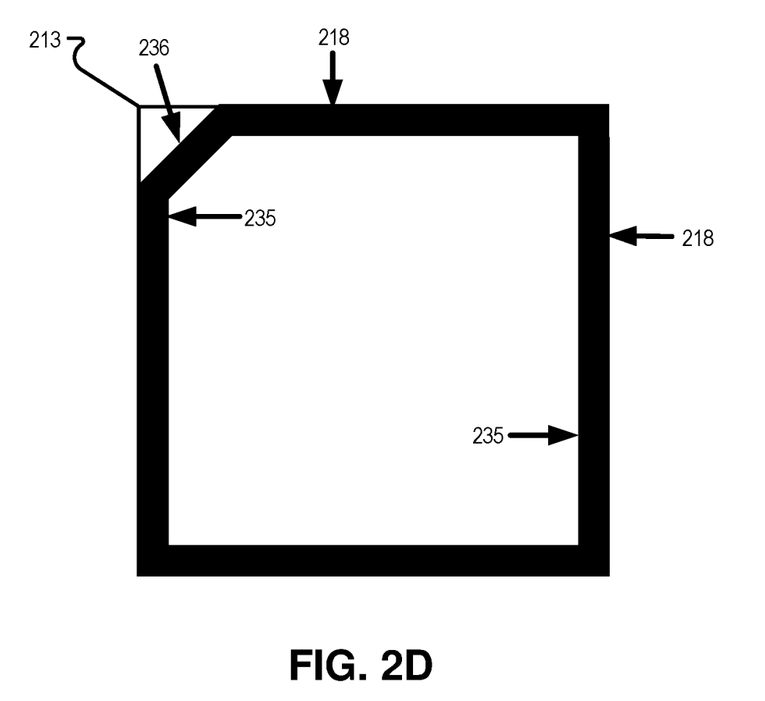
FIG. 2D illustrates a top view of an example coverglass where a trench extends to the outside boundary of the coverglass except for where a key feature deviates from the outside boundary, in accordance with aspects of the disclosure.

FIG. 2D illustrates a top view of an example coverglass 213 where the trench 235 extends to the outside boundary 218 of coverglass 213 except for where a key feature 236 deviates from the outside boundary 218, in accordance with aspects of the disclosure. Trench 235 may include similar features as described in association with trench 233. In some implementations, trench 235 is keyed with a key feature (e.g. key feature 236) to assist in aligning lens assembly 250 with trench 235. Lens assembly 250 may also be keyed to align with trench 235 in a particular orientation. The orientation of optical elements (e.g. lenses or polarizer layers) of lens assembly 250 may need to be aligned with respect to image sensor 120, for example. Of course, different key feature geometries than the illustrated example key feature 236 may be used in accordance with implementations of the disclosure. For example, trench 235 may include notches that align with notches in lens assembly 250 to assist with proper orientation.

Figure 3A:
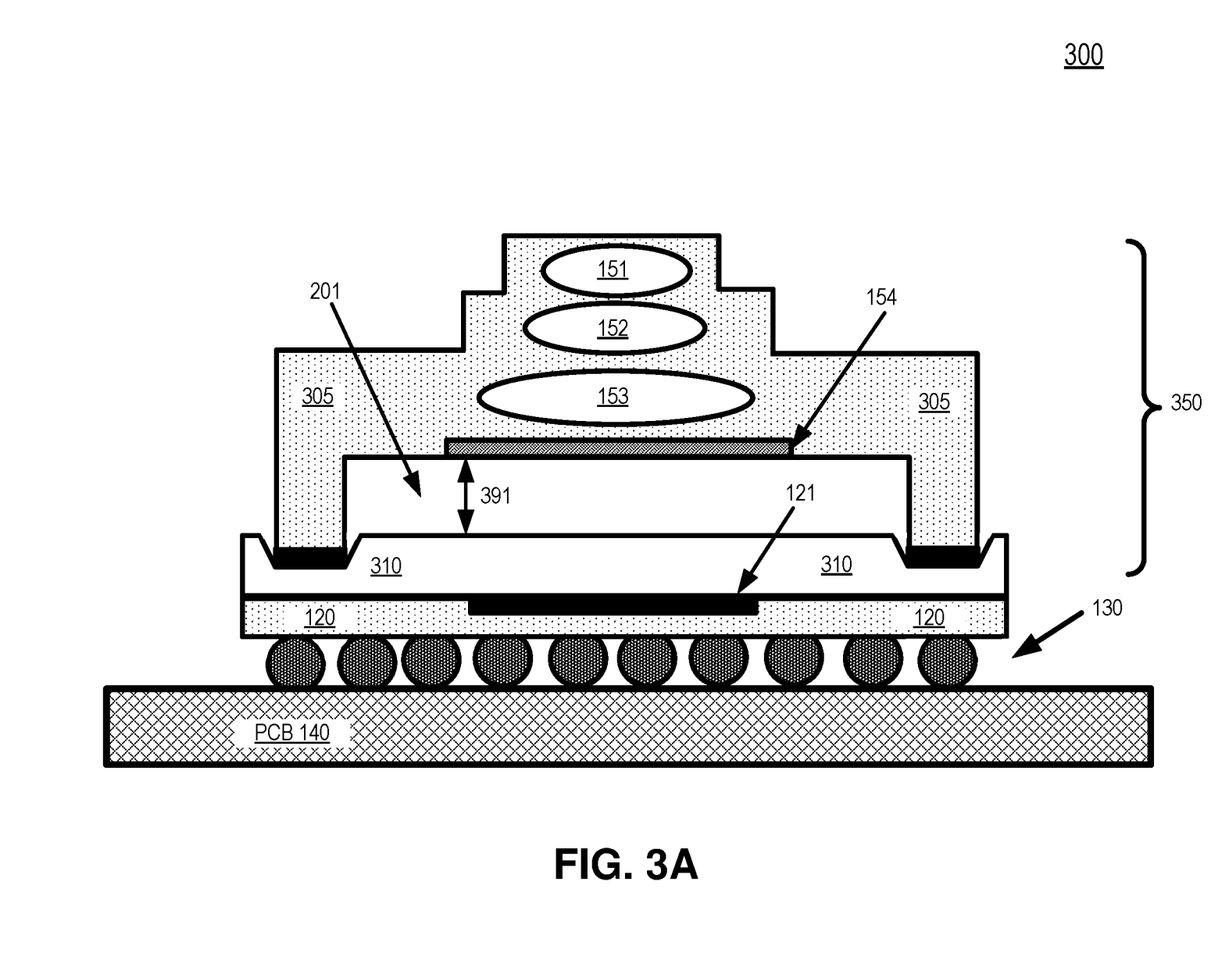
FIG. 3A illustrates a camera assembly including a lens assembly disposed over an image sensor module to focus image light onto an image pixel array of the image sensor, in accordance with aspects of the disclosure.

FIG. 3A illustrates a camera assembly 300 including a lens assembly 350 disposed over image sensor module 201 to focus image light onto an image pixel array 121 of image sensor 120, in accordance with aspects of the disclosure. Image sensor module 201 includes image sensor 120, solder ball grid array 130, and coverglass 310. Image sensor module 201 may be considered a chip scale package (CSP) image sensor. Lens assembly 350 includes assembly body 305 that includes optical elements 151, 152, 153, and 154. FIG. 3A illustrates that coverglass 310 is disposed over image sensor 120 and disposed between image sensor 120 and lens assembly 350. Coverglass 310 includes a trench. The trench illustrated in FIG. 3A does not extend to the outside boundary of coverglass 310. Forming a trench in coverglass 310 allows for a reduced z-height 391 between image sensor 120 and a first optical element (e.g. optical element 154 or 153) of lens assembly 350.

Figure 3B:
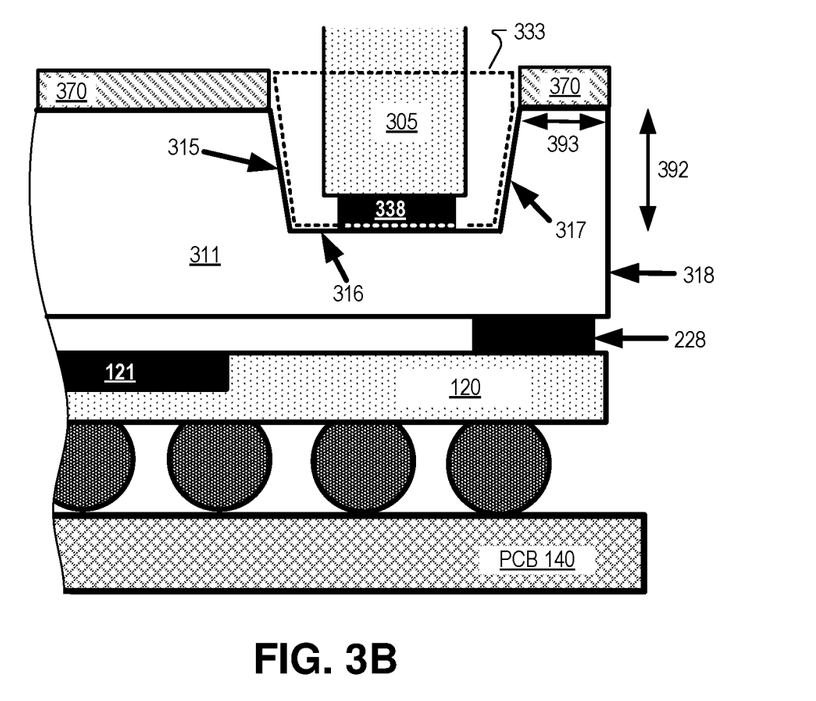
FIG. 3B illustrates a side view of another example trench extending into an example coverglass, in accordance with aspects of the disclosure.

FIG. 3B illustrates a side view of an example trench 333 extending a depth 392 into example coverglass 311, in accordance with aspects of the disclosure. Coverglass 311 may be used as coverglass 310, for example. Trench 333 does not extend to an outside boundary 318 of coverglass 311. Rather, trench 333 has two sidewalls 315 and 317. Having two sidewalls 315 and 317 may assist in containing adhesive 338 and aligning assembly body 305 with trench 333. In some implementations, trench 333 also includes pockets or reservoirs that receive any overflow of adhesive 338 during the bonding process. In other words, when lens assembly 350 is pressed into adhesive 338 in trench 333, excess adhesive flows into the pockets or reservoirs of the trench so that adhesive 338 does not overflow onto the top of coverglass 311 or optical layer 370.

Coverglass 311 is bonded to image sensor 120 by adhesive layer 228, in FIG. 3B. FIG. 3B also illustrates that optical layer 370 may be disposed on coverglass 311 and that trench 333 may extend through optical layer 370. Optical layer 370 may be a wavelength-specific filter, for example.

Forming trench 333 (and any adhesive pocket/reservoirs) into coverglass 311 may be accomplished using a subtractive process such as diamond- turning or pattern etching. When etching is used to form trench 333, sidewall 315 and 317 of trench 333 may be sloped and trench 333 may be slightly larger at the top than a bottom 316 of trench 333. Etching trench 333 may form a surface roughness at the bottom 316 of trench 333 that is greater than a surface roughness of the top surface of coverglass 311 and of a top surface of optical layer 370. The surface roughness of trench bottom 316 may increase the bonding strength of lens assembly 350 to image sensor module 201 when compared with bonding to the top of coverglass 311 or bonding to optical layer 370. Bonding lens assembly 350 to optical layer 370 may risk delaminating optical layer 370 from coverglass 311 and thus bonding lens assembly directly to coverglass 311 inside trench 333 increases the bond strength. Etching processes to form trench 333 may include chemical etching (e.g. acid etch). Photolithography techniques may be used in the etching process. Mechanical etching such as sand blasting or grinding may be used to form trench 333.

Trench 333 has a depth 392 that is a portion of the thickness of coverglass 311, in FIG. 3B. Depth 392 may be between 50 microns and 400 microns, in some implementations. In some implementations, adhesive 338 is an active alignment adhesive. Trench 333 is formed over image sensor 120 but not over image pixel array 121 so that trench 333 does not occlude image light from propagating to image pixel array 121 of image sensor 120.

Figure 3C:
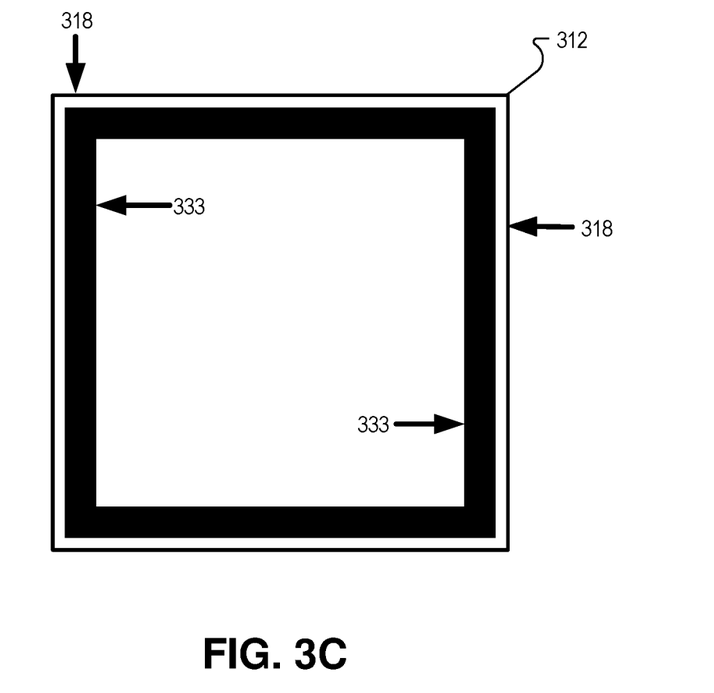
FIG. 3C illustrates a top view of an example coverglass where a trench does not extend to the outside boundary of the coverglass, in accordance with aspects of the disclosure.

FIG. 3C illustrates a top view of an example coverglass 312 where the trench 333 does not extend to the outside boundary 318 of coverglass 312, in accordance with aspects of the disclosure. Rather, trench 333 is offset from the outside boundary 318 of coverglass by an offset distance 393, illustrated in FIG. 3B.

Figure 3D:
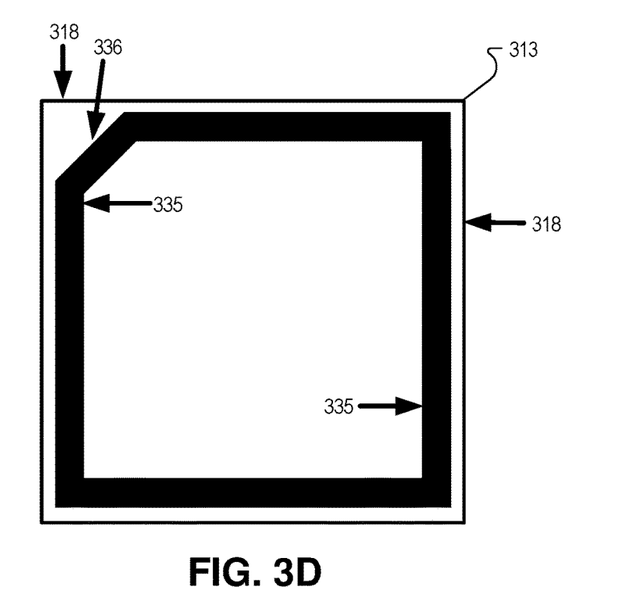
FIG. 3D illustrates a top view of an example coverglass where a trench is offset from the outside boundary of the coverglass except for where a key feature deviates from the offset to the outside boundary, in accordance with aspects of the disclosure.

FIG. 3D illustrates a top view of an example coverglass 313 where the trench 335 is offset from outside boundary 318 of coverglass 313 except for where a key feature 336 deviates from the offset to outside boundary 318, in accordance with aspects of the disclosure. Trench 335 may include similar features as described in association with trench 333. In some implementations, trench 335 is keyed with a key feature (e.g. key feature 336) to assist in aligning lens assembly 350 with trench 335. Lens assembly 350 may also be keyed to align with trench 335 in a particular orientation. The orientation of optical elements (e.g. lenses or polarizer layers) of lens assembly 350 may need to be aligned with respect to image sensor 120, for example. Of course, different key feature geometries than the illustrated example key feature 336 may be used in accordance with implementations of the disclosure. For example, trench 335 may include notches that align with notches in lens assembly 350 to assist with proper orientation.

Figure 3E:
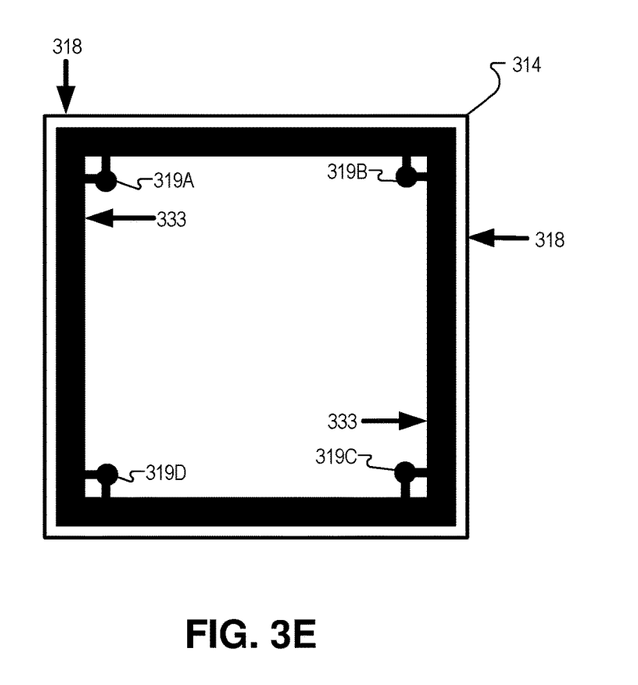
FIGS. 3E and 3F illustrate example adhesive-reservoirs formed in coverglass for receiving excess adhesive, in accordance with aspects of the disclosure.
Figure 3F:
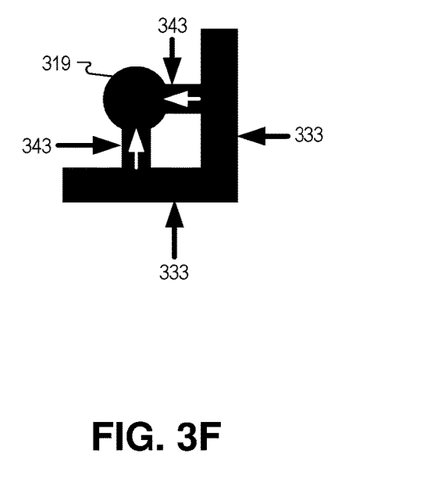

FIGS. 3E and 3F illustrate example adhesive-reservoirs 319 formed in coverglass 314 for receiving excess adhesive, in accordance with aspects of the disclosure. In FIG. 3E, adhesive-reservoirs 319A, 319B, 319C, and 319D are configured to receive any excess adhesive 338 during the bonding process of coverglass 314 to lens assembly 350. Coverglass 314 may be used as coverglass 310. FIG. 3F illustrates one or more channels 343 may be formed in coverglass 314 to receive the flow (illustrated by white arrows) of excess adhesive 338 and guide the excess adhesive into adhesive-reservoir 319. Of course, geometric configurations and spacing of adhesive-reservoirs 319 other than the specific illustrated example of FIGS. 3E and 3F are possible. Channels 343 and adhesive-reservoirs 319 may have a same depth 392 as trench 333. In some implementations, channels 343 are shallower than the depth 392 of trench 333 and adhesive-reservoir 319 has a reservoir-depth that is deeper than a depth of channel 343. This allows a sufficient amount of adhesive 338 to remain at a bottom 316 of trench 333 to bond lens assembly 350 to the coverglass while allowing excess adhesive 338 to flow into the adhesive-reservoir without overflowing to a top of the coverglass.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A camera assembly comprising:
an image sensor for imaging incident image light;
a lens assembly including a first optical element; and
coverglass disposed between the image sensor and the lens assembly, wherein the coverglass includes a trench, and wherein a bottom of the lens assembly is configured to align with the trench and be bonded to the trench to reduce a z-height between the image sensor and a first optical element of the lens assembly.

2. The camera assembly of claim 1, wherein the trench has a depth that is a portion of a thickness of the coverglass.

3. The camera assembly of claim 1, wherein the trench is keyed to align the lens assembly with the image sensor.

4. The camera assembly of claim 1 further comprising:
an optical layer disposed on the coverglass between the lens assembly and the coverglass, wherein the trench extends through the optical layer.

5. The camera assembly of claim 1, wherein the trench is disposed on an outside boundary of the coverglass.

6. The camera assembly of claim 1, wherein the trench has two sidewalls.

7. The camera assembly of claim 1, wherein the lens assembly is bonded to the trench.

8. The camera assembly of claim 1 further comprising:
adhesive-reservoirs extending into the coverglass, wherein the adhesive-reservoirs are configured to accept excess adhesive flowing from the trench.

9. The camera assembly of claim 8 further comprising:
channels extending into the coverglass to guide the excess adhesive to the adhesive-reservoirs.

10. The camera assembly of claim 9, wherein the channels are shallower than a depth of the trench and the adhesive-reservoirs have a reservoir-depth that is deeper than the channels.

11. The camera assembly of claim 1, wherein the lens assembly includes a plurality of optical elements.

12. The camera assembly of claim 1 further comprising:
adhesive disposed at a bottom of the trench, wherein the adhesive bonds the lens assembly to the trench.

13. The camera assembly of claim 1, wherein the bottom of the trench has a surface roughness greater than a roughness of the coverglass.

14. The camera assembly of claim 1, wherein the trench is etched in the coverglass.

15. The camera assembly of claim 1, wherein the trench has a depth into the coverglass between 50 microns and 400 microns.

16. An image sensor module comprising:
an image sensor for imaging incident image light; and
coverglass disposed over the image sensor, wherein the coverglass includes a trench extending a depth into the coverglass, and wherein the trench is configured to receive an assembly body of a lens assembly.

17. The image sensor module of claim 16 further comprising:
an optical layer disposed on the coverglass, wherein the trench extends through the optical layer.

18. The image sensor module of claim 16, wherein the trench is disposed on an outside boundary of the coverglass.

19. The image sensor module of claim 16, wherein the trench has two sidewalls, and wherein the trench is offset from an outside boundary of the coverglass.

20. The image sensor module of claim 16, wherein the trench is formed over the image sensor, but not over an image pixel array of the image sensor.

* * * * *